(12) United States Patent
Li et al.

(10) Patent No.: US 11,761,993 B2
(45) Date of Patent: Sep. 19, 2023

(54) ZERO-CROSSING DETECTION CIRCUIT

(71) Applicant: Hangzhou Lianxintong Semiconductor Co., Ltd., Hangzhou (CN)

(72) Inventors: Hsin-Hsen Li, Hangzhou (CN); Li-Yu Chiu, Hangzhou (CN)

(73) Assignee: Hangzhou Lianxintong Semiconductor Co., Ltd., Hangzhou (CN)

(*) Notice: Subject to any disclaimer, the term of this patent is extended or adjusted under 35 U.S.C. 154(b) by 0 days.

(21) Appl. No.: 17/690,453

(22) Filed: Mar. 9, 2022

(65) Prior Publication Data

US 2023/0176096 A1 Jun. 8, 2023

(30) Foreign Application Priority Data

Dec. 8, 2021 (CN) .......................... 202111489858.5

(51) Int. Cl.
*G01R 19/175* (2006.01)

(52) U.S. Cl.
CPC .................................. *G01R 19/175* (2013.01)

(58) Field of Classification Search
CPC ....................................................... G01R 19/175

USPC ....................................................... 327/78, 79
See application file for complete search history.

(56) References Cited

U.S. PATENT DOCUMENTS

| | | | | |
|---|---|---|---|---|
| 4,229,669 A * | 10/1980 | Smith | ................ | H03K 5/1536 327/79 |
| 10,813,188 B1 * | 10/2020 | Zhang | ................ | H05B 45/31 |
| 2010/0045346 A1 * | 2/2010 | Yoshida | ................ | H03K 5/1536 327/79 |
| 2014/0028354 A1 * | 1/2014 | Yao | ................ | G01R 19/175 327/79 |
| 2014/0266389 A1 * | 9/2014 | Sadwick | ................ | H04B 3/54 327/333 |
| 2016/0371572 A1 * | 12/2016 | Saiki | ................ | G06K 15/406 |
| 2018/0286611 A1 * | 10/2018 | Zhong | ................ | H05B 47/10 |

* cited by examiner

*Primary Examiner* — William Hernandez
(74) *Attorney, Agent, or Firm* — Harness, Dickey & Pierce, P.L.C.

(57) ABSTRACT

The present disclosure discloses a zero-crossing detection circuit, including: a zero-crossing judgment circuit, configured to detect a zero-crossing signal; and an energy storage capacitor, connected to the zero-crossing judgment circuit in parallel, wherein the energy storage capacitor is configured to provide excitation current for the zero-crossing judgment circuit.

8 Claims, 3 Drawing Sheets

000# ZERO-CROSSING DETECTION CIRCUIT

CROSS-REFERENCE TO RELATED APPLICATIONS

The present disclosure claims priority of Chinese patent application with the filing number 2021114898585 filed on Dec. 8, 2021 with the Chinese Patent Office, and entitled "Zero-crossing Detection Circuit", the contents of which are incorporated herein by reference in entirety.

FIELD

The present disclosure relates to the technical field of electronic circuits, and particularly to a zero-crossing detection circuit.

BACKGROUND

This section provides background information related to the present disclosure which is not necessarily prior art.

The zero-crossing detection refers to the detection made by an alternating current system when the waveform is converted from positive semi-cycle to negative semi-cycle and passes through a zero position in the system. Contemporary power carrier communication systems have higher requirements for the accuracy of zero-crossing detection of AC voltage based on the synchronization of carrier data transmission.

For the zero-crossing detection circuits currently on the market, in order to ensure the accuracy of zero-crossing detection, the power consumption of the circuit is larger, and the long-term operation will greatly shorten the service life of the circuit, and also limit, to some extent, the number of communication devices that can be networked.

SUMMARY

This section provides a general summary of the disclosure, and is not a comprehensive disclosure of its full scope or all of its features.

An objective of the present disclosure lies in providing a zero-crossing detection circuit, which can reduce the power consumption of the zero-crossing detection circuit and improve the detection efficiency.

In a first aspect, an embodiment of the present disclosure provides a zero-crossing detection circuit, including:
 a zero-crossing judgment circuit, configured to detect a zero-crossing signal;
 and an energy storage capacitor, connected to the zero-crossing judgment circuit in parallel, wherein the energy storage capacitor is configured to provide excitation current for the zero-crossing judgment circuit.

In an embodiment, a rectification circuit is further included, and is connected to the energy storage capacitor.

In an embodiment, the zero-crossing judgment circuit includes: a zero-crossing judgment module, having a first end and a second end, wherein the first end is connected to a power supply and the second end is grounded; a photoelectric coupler, connected to the zero-crossing judgment module; and an optocoupler driving module (photoelectric coupler driving module), connected to the photoelectric coupler and the energy storage capacitor.

In an embodiment, it includes:
 a first current-limiting resistor, which has two ends connected to the zero-crossing judgment circuit and a first interface of the power supply respectively;
 a second current-limiting resistor, which has two ends connected to the zero-crossing judgment circuit and a second interface of the power supply respectively;
 a third current-limiting resistor, which has two ends connected to the rectification circuit and the second interface of the power supply respectively; and
 a fourth current-limiting resistor, which has two ends connected to the rectification circuit and the first interface of the power supply respectively.

In an embodiment, the optocoupler driving module is a first transistor, and the first transistor has a first end connected to the energy storage capacitor, a second end connected to the photoelectric coupler, and a third end configured to input a control signal.

In an embodiment, the zero-crossing judgment module includes a fifth resistor, and the fifth resistor has one end connected to the power supply, and the other end connected to the photoelectric coupler.

In an embodiment, a first voltage clamp module is further included, and connected to the energy storage capacitor in parallel.

In an embodiment, a second voltage clamp module is further included, and connected to the zero-crossing judgment circuit; and
 a rectification module is further included, and connected to the second voltage clamp module.

In an embodiment, a first diode is further included, and connected to a first end of the zero-crossing judgment circuit; and
 a second diode is further included, and connected to a second end of the zero-crossing judgment circuit.

In an embodiment, the zero-crossing judgment module includes:
 a second transistor, wherein the second transistor has a first end connected to the first resistor, a second end grounded, and a third end connected to the photoelectric coupler and the second resistor respectively.

The technical solutions provided in the above embodiments of the present disclosure adopt the energy storage capacitor having a smaller capacitance value to provide the excitation current for the zero-crossing judgment circuit, and thus quickly provide a correct zero-crossing detection signal, with high efficiency and low power consumption.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

In order to more clearly illustrate technical solutions of embodiments of the present disclosure, accompanying drawings which need to be used in the embodiments will be introduced briefly below.

Corresponding reference numerals indicate corresponding parts throughout the several views of the drawings.

DETAILED DESCRIPTION

Example embodiments will now be described more fully with reference to the accompanying drawings.

In the description of the present disclosure, terms such as "first" and "second" are merely for distinguishing the description, but do not indicate sequence numbers, nor can they be construed as indicating or implying importance in the relativity.

In the description of the present disclosure, the terms "include", "contain", etc. means existence of the feature, integer, step, operation, element and/or component, but does not exclude existence or addition of one or more other features, steps, operations, elements, components and/or collections thereof.

Unless otherwise defined, all of the technical and scientific terms used herein have the same meanings as those generally understood by a person skilled in the art of the present disclosure. Terms used herein in the description of the present disclosure are only for the purpose of describing specific embodiments, rather than limiting the present disclosure.

Technical solutions of the present disclosure will be described below clearly and completely in combination with accompanying drawings.

Figure 1:
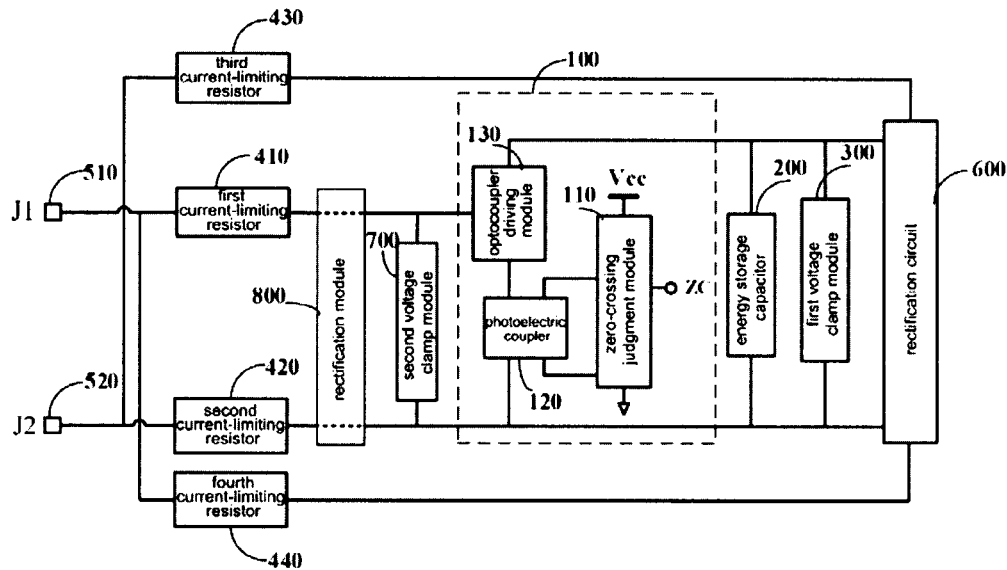
FIG. 1 is a schematic view of a framework of a zero-crossing detection circuit provided in an embodiment of the present disclosure.

Referring to FIG. 1, it is a schematic view of a framework of a zero-crossing detection circuit provided in an embodiment of the present disclosure, including a zero-crossing judgment circuit 100 and an energy storage capacitor 200. The energy storage capacitor 200 may provide excitation power to the zero-crossing judgment circuit 100.

The zero-crossing judgment circuit 100 includes a zero-crossing judgment module 110, a photoelectric coupler 120, and an optocoupler driving module 130. The zero-crossing judgment module 110 has a first end connected to a power supply Vcc, a second end grounded, and a third end and a fourth end connected to the photoelectric coupler 120. The zero-crossing judgment module 110 includes a zero-crossing output signal ZC. When the input alternating current changes from a negative potential to a positive potential or from a positive potential to a negative potential, the output signal of the zero-crossing output signal ZC will change.

The photoelectric coupler 120 includes a light emitting source and a light receiver, wherein the light emitting source may be a light-emitting diode, and the light receiver may be a photosensitive diode, a photosensitive transistor, and so on. The input electrical signal drives the light emitting source, to enable the light emitting source to emit light of a certain wavelength, to thereby generate a photocurrent, and the photocurrent is then amplified by the light receiver and output, thus completing the conversion of electricity-light-electricity.

The optocoupler driving module 130 is connected to the photoelectric coupler 120 and the energy storage capacitor 200, and the optocoupler driving module 130 can function as a control switch.

The zero-crossing detection circuit has a first interface 510 and a second interface 520, wherein the first interface 510 and the second interface 520 may be a live wire and a neutral wire respectively, or the first interface 510 is a neutral wire, and the second interface 520 is a live wire.

The zero-crossing detection circuit may include a rectification circuit 600 connected to the energy storage capacitor 200. The zero-crossing detection circuit further may include a first current-limiting resistor 410, a second current-limiting resistor 420, a third current-limiting resistor 430, a fourth current-limiting resistor 440, and a first voltage clamp module 300. The first voltage clamp module 300 is connected to the energy storage capacitor 200 in parallel, and the first voltage clamp module 300 is configured to limit a maximum charging voltage of the energy storage capacitor 200 when the energy storage capacitor is charged.

Two ends of the first current-limiting resistor 410 are connected to the zero-crossing judgment circuit 100 and the first interface 510, respectively; two ends of the second current-limiting resistor 420 are connected to the zero-crossing judgment circuit 100 and the second interface 520, respectively; two ends of the third current-limiting resistor 430 are connected to the rectification circuit 600 and the second interface 520, respectively; and two ends of the fourth current-limiting resistor 440 are connected to the rectification circuit 600 and the first interface 510, respectively. The current-limiting resistors are configured to protect the circuit and reduce power consumption of the circuit.

The first interface 510 is connected to a control end of the optocoupler driving module 130 through the first current-limiting resistor 410, and a series current of the optocoupler driving module 130 and the photoelectric coupler 120 flows back to the second interface 520 through the connection of the second current-limiting resistor 420. A rectification module 800 can be added to a return path between the first current-limiting resistor 410 and the second current-limiting resistor 420 to save power. A second voltage clamp module 700 may also be connected in parallel to protect the photoelectric coupler 120 and the optocoupler driving module 130.

The first interface 510 and the second interface 520 can form an energy storage power supply loop, with the energy storage capacitor 200, the first voltage clamp module 300, and the rectification circuit 600. The third current-limiting resistor 430 and the fourth current-limiting resistor 440 are connected to the first end and the second end of the rectification circuit 600, respectively. The energy storage capacitor 200 and the first voltage clamp module 300 are connected in parallel between a third end and a fourth end of the rectification circuit 600, and the optocoupler driving module 130 and the photoelectric coupler 120 are also connected therebetween.

Figure 2:
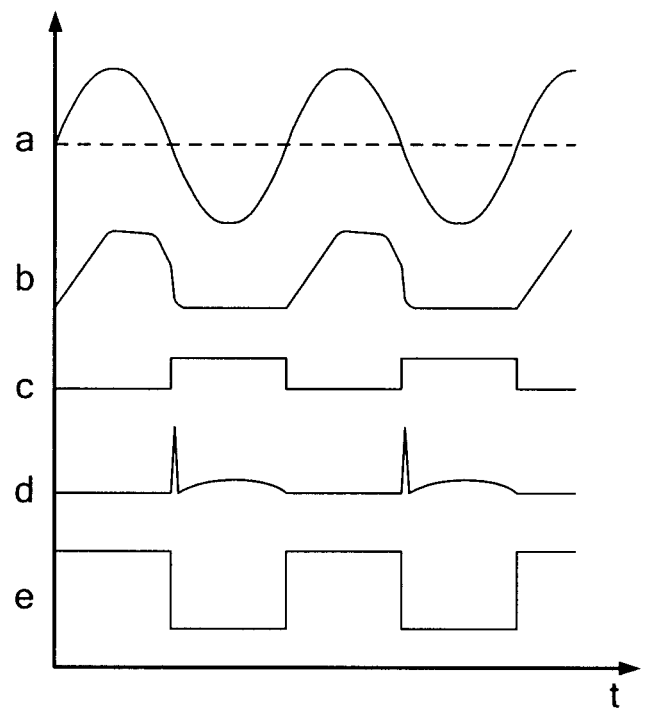
FIG. 2 is a waveform view related to the circuit shown in FIG. 1.

A signal waveform of the second interface is as shown by waveform a of FIG. 2. When a signal of the alternating current inputted to the second interface 520 is positive, the alternating current passes through the third current-limiting resistor 430 and the fourth current-limiting resistor 440, and supplies power to the energy storage capacitor 200 after being rectified by the rectification circuit 600. The maximum charging voltage of the energy storage capacitor 200 is limited by the first voltage clamp module 300. In this case, the signal input by the first interface is negative, so that the cross voltage of the second voltage clamp module 700 is negative, and the zero-crossing judgment circuit 100 is turned off. This phase is a charging process of the energy storage capacitor 200. The signal of the energy storage capacitor 200 is as shown by waveform b of FIG. 2.

When the alternating current electric signal inputted to the second interface 520 gradually turns to a negative voltage, the signal of the first interface 510 becomes a positive voltage, the cross voltage of the second voltage clamp module 700 changes and turns to be positive, and the signal of the second voltage clamp module 700 is as shown by waveform c of FIG. 2. The optocoupler driving module 130 receives a forward voltage and then is turned on, and the energy storage capacitor 200 supplies power to the series circuit where the optocoupler driving module 130 and the photoelectric coupler 120 are located. The photoelectric coupler 120 outputs an excitation current to the zero-crossing judgment module 110, so that the zero-crossing output signal ZC in the zero-crossing judgment module changes, and the signal waveform of the zero-crossing output signal ZC is as shown by waveform e of FIG. 2.

The waveform d of FIG. 2 is a conceptual portray of the on-state current of the series circuit of the optocoupler driving module 130 and the photoelectric coupler 120. Since the capacitance value of the energy storage capacitor 200 is smaller, when the series circuit where the optocoupler driving module 130 and the photoelectric coupler 120 are located is ON due to the change of the cross voltage, the charges stored in the energy storage capacitor 200 will be quickly drawn, and the cross voltage of the energy storage capacitor 200 drops rapidly, and the on-state current of the series circuit of the optocoupler driving module 130 and the photoelectric coupler 120 also drops rapidly therewith, therefore, a peak value is generated.

Thereafter, the photoelectric coupler 120 is supplied by the optocoupler driving module 130 with a current that is tiny but enough to support continuous ON of the light-emitting diode in the photoelectric coupler 120, and the zero-crossing judgment module 110 also outputs a correct signal. This state will continue to the next cycle, that is, when the second interface inputs a positive voltage again.

Figure 3:
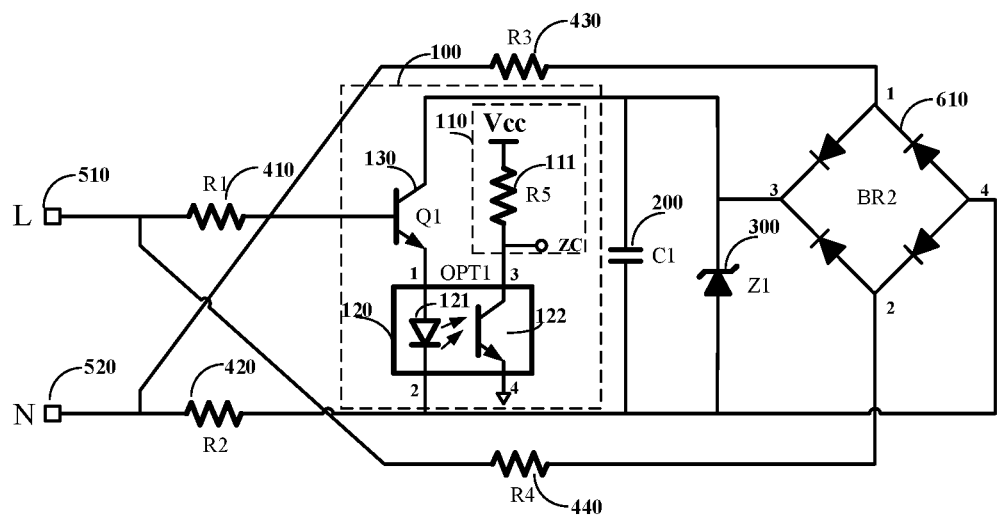
FIG. 3 is a structural schematic view of a zero-crossing detection circuit provided in an embodiment of the present disclosure.

Referring to FIG. 3, it is a structural schematic view of a zero-crossing detection circuit provided in an embodiment of the present disclosure, in which the full-wave rectification circuit may be a bridge rectifier 610, and the bridge rectifier 610 is composed of four diodes.

The photoelectric coupler 120 includes a light-emitting diode 121 and a photosensitive transistor 122, a positive electrode of the light-emitting diode 121 is a first end of the photoelectric coupler 120, and a negative electrode of the light-emitting diode 121 is a second end of the photoelectric coupler 120. An end of the photosensitive transistor 122 is a third end of the photoelectric coupler 120, and a second end of the photosensitive transistor 122 is a fourth end of the photoelectric coupler 120.

In an embodiment, the optocoupler driving module 130 is a first transistor, and the first transistor has a first end connected to the energy storage capacitor 200, a second end connected to the photoelectric coupler 120, and a third end configured to input a control signal.

In an embodiment, the first transistor 130 may be an NPN transistor 130, the first end is a collector of the NPN transistor 130, and is connected to the energy storage capacitor 200, a negative electrode of a Zener diode 300, and a third end of the full-wave rectifier; the second end is an emitter, and is connected to the first end of the photoelectric coupler 120; the third end is a base, and is connected to the first interface 510 via the first current-limiting resistor 410 for inputting a control signal. The zero-crossing judgment module 110 includes a fifth resistor 111, wherein one end of the fifth resistor 111 is connected to the power supply Vcc, and a connection point between the other end and the third end of the photoelectric coupler 120 is the zero-crossing output signal ZC.

The first interface 510 of the circuit shown in FIG. 3 is a live wire, and the second interface 520 is a neutral wire. A first end of the full-wave rectifier 610 is connected to the second interface 520 via a third current-limiting resistor 430, and a second end of the full-wave rectifier 610 is connected to the first interface 510 via a fourth current-limiting resistor 440.

In an embodiment, the first voltage clamp module may be the Zener diode 300, a negative electrode of the Zener diode 300 is connected to the third end of the full-wave rectifier 610, and a positive electrode thereof is connected to a fourth end of the full-wave rectifier 610 and the second current-limiting resistor 420. The energy storage capacitor 200 is connected to the Zener diode 300 in parallel. In this embodiment, the zero-crossing detection circuit may not include the second voltage clamp module shown in FIG. 1, and the function of the second voltage clamp module may be completed by a part of the diodes in the full-wave rectifier 610.

Figure 4:
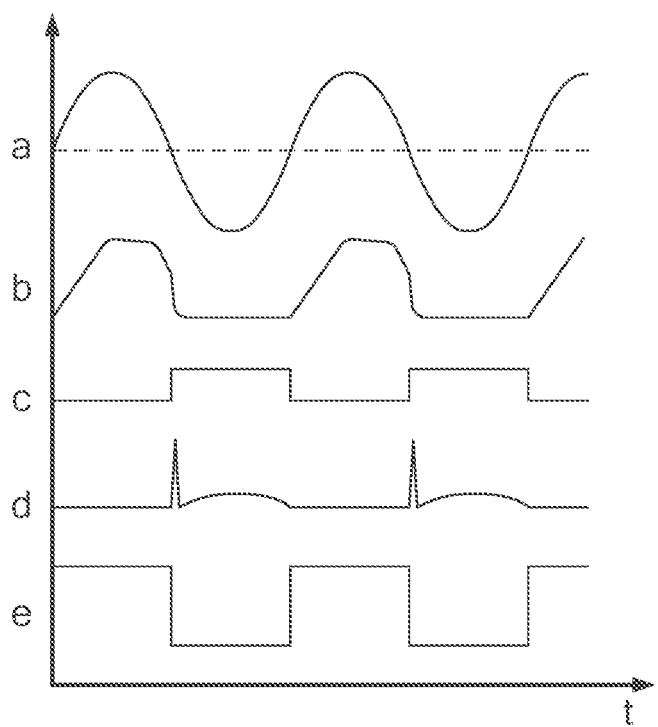
FIG. 4 is a waveform view related to the circuit shown in FIG. 3.

The signal waveform of the second interface is as shown by waveform a of FIG. 4, and when the signal of the second interface 520 is positive, and the signal of the first interface 510 is negative, the alternating current, passing through the third current-limiting resistor 430, is input from the first end of the full-wave rectifier 610, and output from the third end of the full-wave rectifier to the Zener diode 300 and charge the energy storage capacitor 200. The highest voltage of the energy storage capacitor 200 is limited by the Zener diode 300. The signal of the energy storage capacitor 200 is as shown by waveform b of FIG. 4. The current is input to the fourth end of the full-wave rectifier 610, output from the second end, and flows through the fourth current-limiting resistor 440 to the second interface 510.

During the energy storage charging phase, as the crossing voltage between the base and the emitter of the NPN transistor 130 is limited to be negative potential, the NPN transistor 130 is turned off, there is no current flowing into and out of the photoelectric coupler 120, the zero-crossing judgment module receives the voltage of the power supply, the zero-crossing output signal ZC is maintained at the potential of the power supply, and the zero-crossing output signal ZC is as shown by waveform e of FIG. 4.

When the signal of the second interface 520 gradually changes to a negative voltage, the potential of the first interface 510 is increased to a positive voltage, and the cross voltage between the base and the emitter of the NPN transistor 130 changes, specifically as shown by waveform c of FIG. 4. In this case, the NPN transistor 130 and the light-emitting diode in the photoelectric coupler 120 are turned on, and a current is quickly drawn from the energy storage capacitor 200. The waveform d of FIG. 4 is an on-state current flowing through the NPN transistor 130 and the light-emitting diode in the photoelectric coupler 120. The current of the energy storage capacitor 200 is acquired, and the third end of the photoelectric coupler is excited to introduce the current from the power supply, so that the zero-crossing output signal ZC turns to a low potential, as shown by waveform e of FIG. 4.

The energy storage capacitor 200 supplies power to the NPN transistor 130 and the photoelectric coupler 120 until the current is 0, and then the first interface 510 supplies power to the photoelectric coupler 120 through the base of the NPN transistor 130 via the first current-limiting resistor 410. Due to the existence of the first current-limiting resistor 410, the current flowing on the circuit is small, but is sufficient to supply power to the light-emitting diode 121 in the photoelectric coupler 120, and excite the photosensitive transistor 122 to draw the current from a fifth resistor 111 in the zero-crossing judgment module 110, so that the zero-crossing output signal ZC continues to remain at a low potential. The zero-crossing output signal ZC will continue to be in a low-potential state until the next cycle starts, the second interface 520 inputs a positive voltage, the first interface 510 inputs a negative voltage, then the NPN transistor 130 is turned off again, and the zero-crossing output signal ZC will be charged toward the power supply and become a high potential, thereby generating a waveform change, and realizing accurate zero-crossing judgment.

In this embodiment of the present disclosure, a relatively large current passes through the photoelectric coupler only in a relatively short time, and the photoelectric coupler remains in the rest time in a state of being turned off or having a trace amount of current passing therethrough, which not only can greatly reduce the power consumption of the zero-crossing detection circuit, but also can effectively extend the service life of the optocoupler driving module and the photoelectric coupler.

Figure 5:
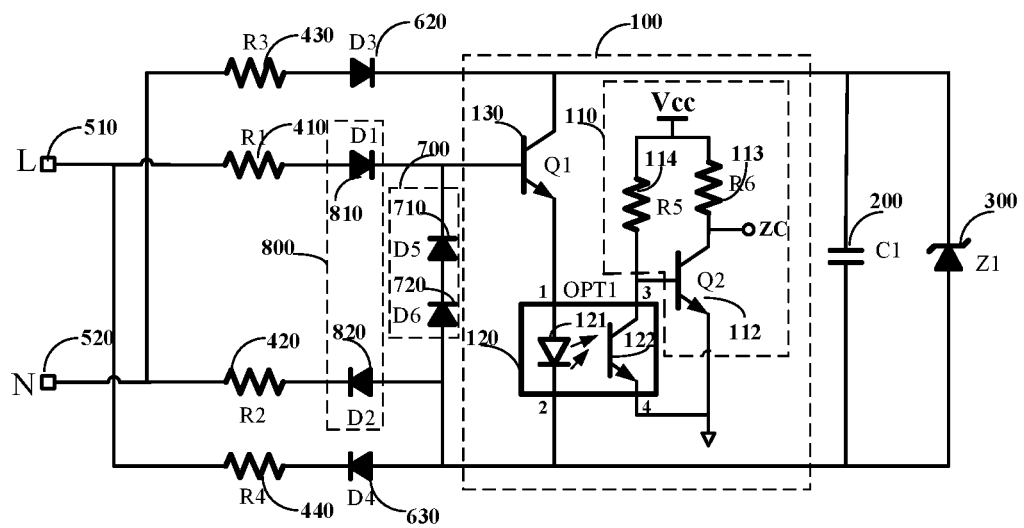
FIG. 5 is a structural schematic view of another zero-crossing detection circuit provided in an embodiment of the present disclosure.

Referring to FIG. 5, it is a structural schematic view of another zero-crossing detection circuit provided in an embodiment of the present disclosure, wherein the zero-crossing detection circuit includes a second voltage clamp module 700, a rectification module 800, a first diode 620, and a second diode 630. The second voltage clamp module 700 includes a diode 710 and a diode 720, and the rectification module 800 includes a diode 810 and a diode 820. The second voltage clamp module 700 is connected to the zero-crossing judgment circuit 100, and the rectification module 800 is connected to the second voltage clamp module.

The zero-crossing judgment module includes a second transistor 112, a first resistor 113, and a second resistor 114, wherein a connection point between the first end of the second transistor 112 and the first resistor is the zero-crossing output signal ZC, and the second end of the second transistor 112 is grounded and connected to the fourth end of the photoelectric coupler 120, and the third end of the second transistor 112 is connected to the photoelectric coupler 120 and the second resistor 114 respectively. The second transistor may be an NPN transistor 112, wherein the first end is a collector of the NPN transistor 112, the second end is an emitter of the NPN transistor 112, and the third end is a base of the NPN transistor.

In this embodiment, the first interface 510 is a live wire, and the second interface 520 is a neutral wire. The first interface 510 is connected to the positive electrode of the diode 810 via the first current-limiting resistor 410, and is connected to the negative electrode of the second diode 630 via the fourth current-limiting resistor 440. The second interface 520 is connected to the negative electrode of the diode 820 through the second current-limiting resistor 420, and is connected to the positive electrode of the first diode 620 through the third current-limiting resistor 430.

The first voltage clamp module is a Zener diode 300, the negative electrode of the Zener diode 300 is connected to the negative electrode of the first diode 620, the positive electrode of the Zener diode 300 is connected to the positive electrode of the second diode 630, and the energy storage capacitor 200 is connected to the Zener diode 300 in parallel.

The optocoupler driving module 130 is a first transistor, and the first transistor has a first end connected to the energy storage capacitor 200, a second end connected to the photoelectric coupler 120, and a third end configured to input a control signal. The first transistor 130 may be an NPN transistor 130, the first end is a collector of the NPN transistor 130, and connected to the energy storage capacitor 200, the negative electrode of the Zener diode 300, and the negative electrode of the first diode 620; the second end is an emitter, and connected to the first end of the photoelectric coupler 120; and the third end is a base, and connected to the negative electrode of the diode 810.

The second end of the photoelectric coupler 120 is connected to the positive electrode of the diode 820, the third end of the photoelectric coupler 120 is connected to the second resistor 114 and the base of the second transistor 112, and the fourth end of the photoelectric coupler 120 and the emitter of the second transistor 112 are grounded.

Figure 6:
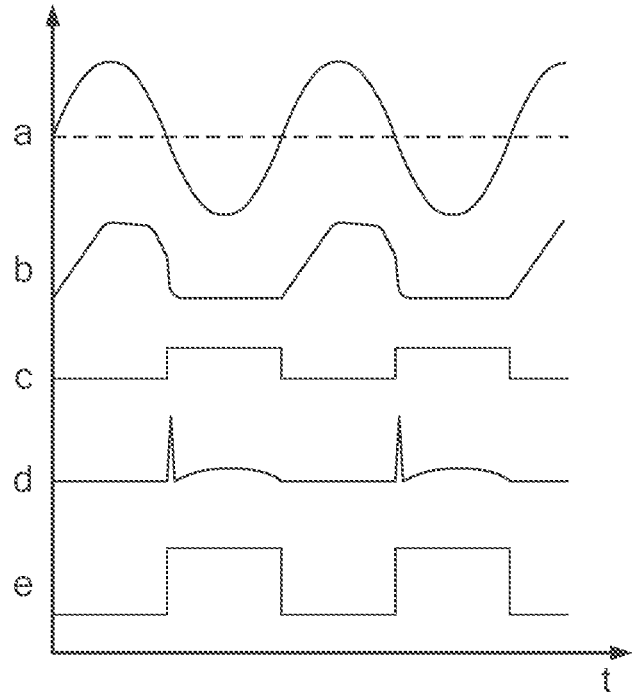
FIG. 6 is a waveform view related to the circuit shown in FIG. 5.

A signal waveform of the second interface is as shown by waveform a of FIG. 6, and when a signal of the second interface 520 is positive, the signal of the first interface 510 is negative, the alternating current is output to the Zener diode 300 through the third current-limiting resistor 430 and the first diode 620 to charge the energy storage capacitor 200. The maximum voltage of the energy storage capacitor 200 is limited by the Zener diode 300. The signal of the energy storage capacitor 200 is as shown by waveform b of FIG. 6. The current flows through the second diode 630 and the fourth current-limiting resistor 440 to the first interface 510.

In the energy storage charging phase, the cross voltage of the second voltage clamp module 700 is limited to a negative potential, which turns the NPN transistor 130 and the light-emitting diode 121 in the photoelectric coupler 120 off, and as the second transistor 112 and the first resistor 113 form an inverse gain stage, the zero-crossing output signal ZC is at a low level, and the zero-crossing output signal ZC is as shown by waveform e of FIG. 6.

When the signal of the second interface 520 gradually turns to a negative voltage, the potential of the first interface 510 is increased and turns to a positive voltage, and the cross voltage of the second voltage clamp module 700 changes, specifically as shown by waveform c of FIG. 6. In this case, the NPN transistor 130 and the light-emitting diode in the photoelectric coupler 120 are turned on, and a current is quickly drawn from the energy storage capacitor 200. The waveform d of FIG. 6 is for an on-state current flowing through the NPN transistor 130 and the light-emitting diode in the photoelectric coupler 120. The current of the energy storage capacitor 200 is acquired, and the third end of the photoelectric coupler 120 is excited to introduce the current from the power supply. Due to the inverse gain effect of the second transistor 112 and the first resistor 113, the zero-crossing output signal ZC becomes a high potential, as shown by the waveform e of FIG. 6.

The energy storage capacitor 200 supplies power to the NPN transistor 130 and the photoelectric coupler 120 until the current is 0, and then the first interface 510 supplies power to the photoelectric coupler 120 through the base of the NPN transistor 130 via the first current-limiting resistor 410 and the diode 810. Due to the existence of the first current-limiting resistor, the current flowing on the circuit is small, but is sufficient to supply power to the light-emitting diode 121 in the photoelectric coupler 120, and supply power to the zero-crossing judgment module 110, so that the zero-crossing output signal ZC continues to remain at a high potential. The zero-crossing output signal ZC will continue to be in a high-potential state until the next cycle starts, the second interface 520 inputs a positive voltage, then the zero-crossing output signal ZC will become a low potential, thus realizing the zero-crossing judgment.

In this embodiment, the half-wave rectifier constituted by the rectification module 800 can save the loop current of half cycle.

In the several embodiments provided in the present disclosure, the circuits and the methods disclosed also can be implemented in other modes. The apparatus embodiments described above are merely exemplary, for example, the flowcharts and the block diagrams in the accompanying drawings illustrate possible system architectures, functions, and operations of the apparatus, method, and computer program products according to multiple embodiments of the present disclosure. In this regard, each block in the flowcharts or the block diagrams may represent a part of a module, program segment or code, and the part of the module, program segment, or code contains one or more executable instructions configured to achieve a specified logical function. In some alternative implementations, functions marked in the blocks also can occur in an order different from that marked in the accompanying drawings. For example, two continuous blocks practically can be executed substantially in parallel, and they sometimes also may be executed in a reverse order, which depends upon a function involved. It also should be noted that each block in the block diagrams and/or flowcharts, and combinations of the blocks in the block diagrams and/or the flowcharts can be realized by a dedicated hardware-based system configured to execute a specified function or action, or can be realized by a combination of dedicated hardware and computer instructions.

Besides, the various functional modules in various embodiments of the present disclosure can be integrated together to form one independent portion, and it is also possible that the various modules exist independently, or that two or more modules are integrated to form one independent part.

The above are merely for preferred embodiments of the present disclosure and not used to limit the present disclosure. For one skilled in the art, various modifications and changes may be made to the present disclosure. Any modifications, equivalent substitutions, improvements and so on, made within the spirit and principle of the present disclosure, should be covered within the scope of protection of the present disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A zero-crossing detection circuit, comprising:
    a zero-crossing judgment circuit, configured to detect a zero-crossing signal; and
    an energy storage capacitor, connected to the zero-crossing judgment circuit in parallel, wherein the energy storage capacitor is configured to provide excitation current for the zero-crossing judgment circuit; and
    the zero-crossing detection circuit further comprising a rectification circuit, connected to the energy storage capacitor; and
    the zero-crossing judgment circuit comprises:
    a zero-crossing judgment module, having a first end and a second end, wherein the first end is connected to a power supply, and the second end is grounded;
    a photoelectric coupler, connected to the zero-crossing judgment module; and
    an optocoupler driving module, connected to the photoelectric coupler and the energy storage capacitor.

2. The zero-crossing detection circuit according to claim 1, wherein the optocoupler driving module is a first transistor, and the first transistor has a first end connected to the energy storage capacitor, a second end connected to the photoelectric coupler, and a third end configured to input a control signal.

3. The zero-crossing detection circuit according to claim 1, wherein the zero-crossing judgment module comprises a fifth resistor, and the fifth resistor has one end connected to the power supply, and the other end connected to the photoelectric coupler.

4. The zero-crossing detection circuit according to claim 1, wherein the zero-crossing judgment module comprises:
    a second transistor, wherein a second transistor has a first end connected to a first resistor, a second end grounded, and a third end respectively connected to the photoelectric coupler and the second resistor.

5. The zero-crossing detection circuit according to claim 1, comprising:
    a first current-limiting resistor, having two ends connected to the zero-crossing judgment circuit and a first interface of a power supply respectively;
    a second current-limiting resistor, having two ends connected to the zero-crossing judgment circuit and a second interface of the power supply respectively;
    a third current-limiting resistor, having two ends connected to the rectification circuit and the second interface of the power supply respectively; and
    a fourth current-limiting resistor, having two ends connected to the rectification circuit and the first interface of the power supply respectively.

6. The zero-crossing detection circuit according to claim 1, further comprising:
    a first voltage clamp module, connected to the energy storage capacitor in parallel.

7. The zero-crossing detection circuit according to claim 1, further comprising:
    a second voltage clamp module, connected to the zero-crossing judgment circuit; and
    a rectification module, connected to the second voltage clamp module.

8. The zero-crossing detection circuit according to claim 7, further comprising:
    a first diode, connected to a first end of the zero-crossing judgment circuit; and
    a second diode, connected to a second end of the zero-crossing judgment circuit.

* * * * *